(12) United States Patent
Chen

(10) Patent No.: US 12,389,799 B2
(45) Date of Patent: *Aug. 12, 2025

(54) PIEZOELECTRIC DEVICE AND METHOD OF FORMING THE SAME

(71) Applicant: Taiwan Semiconductor Manufacturing Company, Ltd., Hsinchu (TW)

(72) Inventor: Chih-Ming Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 39 days.

This patent is subject to a terminal disclaimer.

(21) Appl. No.: 18/513,640

(22) Filed: Nov. 20, 2023

(65) Prior Publication Data

US 2024/0090334 A1  Mar. 14, 2024

Related U.S. Application Data

(63) Continuation of application No. 17/988,723, filed on Nov. 16, 2022, now Pat. No. 11,856,859, which is a
(Continued)

(51) Int. Cl.
| | |
|---|---|
| *H10N 30/50* | (2023.01) |
| *H10N 30/00* | (2023.01) |
| *H10N 30/076* | (2023.01) |
| *H10N 30/853* | (2023.01) |
| *H10N 30/87* | (2023.01) |

(Continued)

(52) U.S. Cl.
CPC ......... *H10N 30/708* (2024.05); *H10N 30/076* (2023.02); *H10N 30/501* (2023.02); *H10N 30/853* (2023.02); *H10N 30/871* (2023.02); *H10N 30/872* (2023.02); *G02B 3/14* (2013.01); *G02B 26/004* (2013.01); *H10N 30/01* (2023.02); *H10N 30/204* (2023.02)

(58) Field of Classification Search
CPC ...... H10N 30/07; H10N 30/082; H10N 30/20; H10N 30/30; H10N 30/50; H10N 30/883; H10N 30/708; H10N 30/076; H10N 30/501; H10N 30/853; H10N 30/871; H10N 30/872; H10N 30/01; H10N 30/204; H10N 30/704; H10N 30/02; H10N 30/80; H10N 30/05; G02B 3/14; G02B 26/004
See application file for complete search history.

(56) References Cited

U.S. PATENT DOCUMENTS 10,032,977 B2 * 7/2018 Fujimori .................. B41J 2/161
11,527,701 B2 * 12/2022 Chen ..................... G02B 26/004
(Continued)

*Primary Examiner* — Eduardo A Rodela
(74) *Attorney, Agent, or Firm* — JCIPRNET

(57) ABSTRACT

A piezoelectric device including a substrate, a metal-insulator-metal element, a hydrogen blocking layer, a passivation layer, a first contact terminal and a second contact terminal is provided. The metal-insulator-metal element is disposed on the substrate. The hydrogen blocking layer is disposed on the metal-insulator-metal element. The passivation layer covers the hydrogen blocking layer and the metal-insulator-metal element. The first contact terminal is electrically connected to the metal-insulator-metal element. The second contact terminal is electrically connected to the metal-insulator-metal element.

20 Claims, 13 Drawing Sheets

Related U.S. Application Data continuation of application No. 16/666,395, filed on Oct. 28, 2019, now Pat. No. 11,527,701.

(51) Int. Cl.
  *G02B 3/14* (2006.01)
  *G02B 26/00* (2006.01)
  *H10N 30/01* (2023.01)
  *H10N 30/20* (2023.01)

(56) References Cited

U.S. PATENT DOCUMENTS

| | | | |
|---|---|---|---|
| 11,856,859 B2 * | 12/2023 | Chen | H10N 30/872 |
| 2012/0236083 A1 * | 9/2012 | Mizukami | B41J 2/1612 |
| | | | 347/70 |
| 2015/0077475 A1 * | 3/2015 | Mizukami | H10N 30/101 |
| | | | 29/25.35 |

* cited by examiner

PIEZOELECTRIC DEVICE AND METHOD OF FORMING THE SAME

CROSS-REFERENCE TO RELATED APPLICATION

This application is a continuation application of and claims the priority benefit of a prior application Ser. No. 17/988,723, filed on Nov. 16, 2022. The prior application Ser. No. 17/988,723 is a continuation application of and claims the priority benefit of a prior application Ser. No. 16/666,395, filed on Oct. 28, 2019. The entirety of each of the above-mentioned patent applications is hereby incorporated by reference herein and made a part of this specification.

BACKGROUND

Piezoelectric devices are used in many fields and the global demand for piezoelectric devices becomes strong nowadays.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
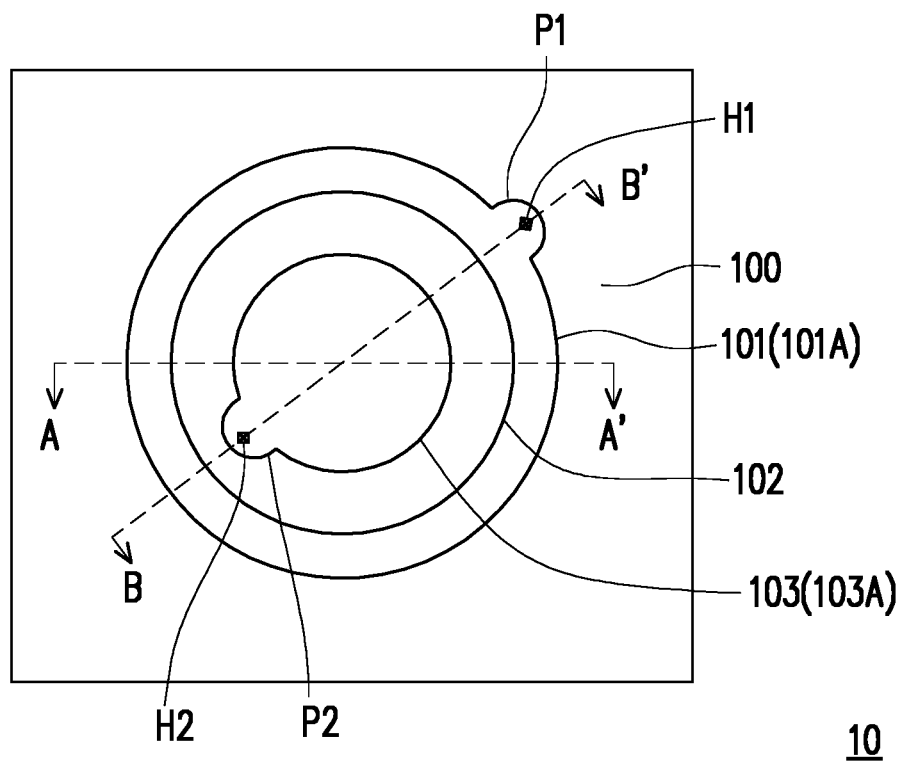
FIG. 1 is a schematic cross-sectional view illustrating a piezoelectric device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Piezoelectric devices are devices utilizing piezoelectric effects, including piezoelectric sensors, actuators, transducers, transformers and motors. A piezoelectric device (such as an actuator) may include a piezoelectric layer stacked between a first electrode and a second electrode. When a voltage is applied, the electrical field generated by the applied voltage will cause the piezoelectric layer to stretch or compress in a direction normal to the piezoelectric layer (i.e. deform). The deformation of the piezoelectric layer is translated into a physical displacement. Such physical displacement may be used to move or position objects in various kinds of mechanical systems and optical systems. The amount of the physical displacement or movement generally depends upon the voltage applied as well as the piezoelectric coefficient of the piezoelectric layer (i.e. the efficiency of the piezoelectric material in transferring the electrical energy to mechanical energy). The performance of the piezoelectric devices may be determined by the characteristics of the piezoelectric layer in the piezoelectric devices. For improving the reliability of the piezoelectric devices, the amount of the hydrogen-ions present in the piezoelectric layer of the piezoelectric device is better to be reduced or minimized.

During the manufacturing processes, hydrogen-ion containing processing may be performed after the formation of the piezoelectric layer, which may cause the inclusion of the hydrogen-ions into the piezoelectric layer and degrade the reliability of the piezoelectric devices. According to some embodiments, it is desirable to form a blocking material or a shielding layer deterring and hindering the hydrogen-ions from entering into the piezoelectric layer before performing hydrogen-ion containing processing.

Figure 2:
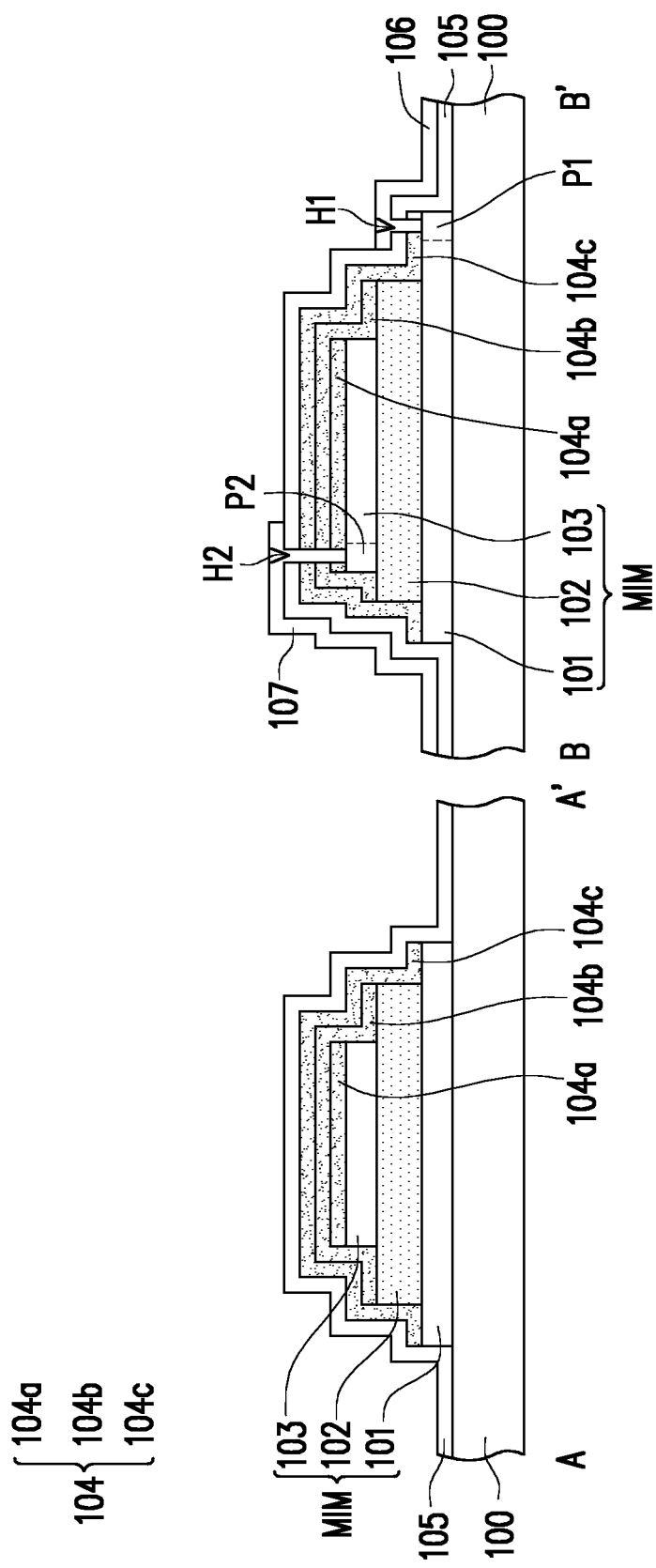
FIG. 2 is a schematic top view illustrating a piezoelectric device in accordance with some embodiments.

FIG. 1 is a schematic cross-sectional view illustrating a piezoelectric device in accordance with some embodiments. FIG. 2 is a schematic top view illustrating a piezoelectric device in accordance with some embodiments. FIG. 2 is a cross-sectional view taken along line A-A' and line B-B' of FIG. 1. It should be noted that for simplicity, certain elements of the piezoelectric device 10 in FIG. 2 are omitted.

Referring to FIG. 1 and FIG. 2, the piezoelectric device 10 includes a substrate 100, a first electrode 101, a piezoelectric layer 102, a second electrode 103, a hydrogen blocking layer 104, a passivation layer 105, a first contact terminal 106 and a second contact terminal 107. In some embodiments, the first electrode 101 is disposed on the substrate 100, the piezoelectric layer 102 is disposed on the first electrode 101, the second electrode 103 is disposed on the piezoelectric layer 102, the hydrogen blocking layer 104 is disposed on the second electrode 103, the passivation layer 105 covers the hydrogen blocking layer 104, the second electrode 103, the piezoelectric layer 102 and the first electrode 101, the first contact terminal 106 is electrically connected to the first electrode 101, and the second contact terminal 107 is electrically connected to the second electrode 103.

In FIG. 1 and FIG. 2, the first electrode 101, the piezoelectric layer 102 and the second electrode 103 are sequentially stacked on the substrate 100. In other words, the piezoelectric layer 102 is located between the first electrode 101 and the second electrode 103. In some embodiments, the first electrode 101 includes a first metal pattern 101A, and the second electrode 103 includes a second metal pattern 103A. In some embodiments, the material of the piezoelectric layer 102 includes a piezoelectric ceramic material such as lead zirconate titanate (PZT). Specifically, the stacked structure of the first electrode 101, the piezoelectric layer 102 and the second electrode 103 constitutes a metal-insulator-metal element MIM. That is to say, in some embodiments, the metal-insulator-metal element MIM is disposed on the substrate 100, the hydrogen blocking layer 104 is disposed on the metal-insulator-metal element MIM, the passivation layer 105 covers the hydrogen blocking layer 104 and the metal-insulator-metal element MIM, and the first contact terminal 106 and the second contact terminal 107 are electrically connected to the metal-insulator-metal element MIM.

Still referring to FIG. 1, from the top view, the first electrode 101 is designed to be a substantially circular electrode with a contact portion P1 protruding from the contour of the circular electrode, and the second electrode 103 is designed to be a substantially circular electrode with a contact portion P2 protruding from the contour of the circular electrode. However, the disclosure is not limited thereto. In some alternative embodiments, the shapes of the patterns of the first electrode 101 and the second electrode 103 may be oval shapes, tetragonal, hexagonal or polygonal shapes or any suitable shapes from the top view. In addition, the shape of the pattern of the piezoelectric layer 102 is designed, corresponding to the shapes of the top and bottom electrodes 101, 103, to be a circular shape. From the top view as shown in FIG. 1, the shapes of the first electrode 101, the piezoelectric layer 102 and the second electrode 103 are arranged as concentric circles. However, the disclosure is not limited thereto. In some alternative embodiments, the shape of the pattern of the piezoelectric layer 102 may designed to be a polygonal shape or any suitable shape from the top view. In yet alternative embodiments, the shapes of the first electrode 101, the piezoelectric layer 102 and the second electrode 103 may be arranged as non-concentric circles.

Continue referring to FIG. 1, from the top view, the span of the first electrode 101 is greater than the span of the piezoelectric layer 102, and the span of the piezoelectric layer 102 is greater than the span of the second electrode 103. From another point of view, the first electrode 101, the piezoelectric layer 102 and the second electrode 103 constitute a staircase shaped stacked-structure, as shown in the cross-section of FIG. 2.

In some embodiments, the first contact terminal 106 is electrically connected to the first electrode 101 through a first contact hole H1 in the passivation layer 105 and the hydrogen blocking layer 104, and the second contact terminal 107 is electrically connected to the second electrode 103 through a second contact hole H2 in the passivation layer 105 and the hydrogen blocking layer 104. In detail, the first contact terminal 106 is electrically connected to the contact portion P1 of the first electrode 101, and the second contact terminal 107 is electrically connected to the contact portion P2 of the second electrode 103. In some embodiments, the first contact terminal 106 and the second contact terminal 107 both may serve as external input/output terminals of the piezoelectric device 10. When a voltage is applied between the first contact terminal 106 and the second contact terminal 107, the same voltage is applied between the first electrode 101 and the second electrode 103. The electrical field caused by the applied voltage can cause the piezoelectric layer 102 to stretch or compress in a direction normal to the surface of the substrate 100. The stretch and compression of the piezoelectric layer 102 is translated into a physical displacement for controlling a mechanical system or optical system.

In some embodiments, the hydrogen blocking layer 104 includes a first hydrogen blocking layer 104a, a second hydrogen blocking layer 104b and a third hydrogen blocking layer 104c. That is to say, in some embodiments, the hydrogen blocking layer 104 is a multilayer structure. Specifically, as shown in FIG. 2, the first hydrogen blocking layer 104a covers and contacts the top surface of the second electrode 103, the second hydrogen blocking 104b layer covers the first hydrogen blocking layer 104a and contacts the top surface of the piezoelectric layer 102, and the third hydrogen blocking layer 104c covers the second hydrogen blocking layer 104b and contacts the top surface of the first electrode 101. In other words, during the fabrication process of the piezoelectric device 10, the hydrogen blocking layer 104 covers and protects the outermost top surface of the metal-insulator-metal element MIM. Because the hydrogen blocking layer 104 covers and protects the outermost top surface of the metal-insulator-metal element MIM, the hydrogen-ions of the photoresist layer are barred from penetrating into the metal-insulator-metal element MIM by the hydrogen blocking layer 104. As such, no hydrogen-ions or minimal hydrogen-ions are included in the piezoelectric layer 102 of the piezoelectric device 10 and the piezoelectric characteristics of the piezoelectric layer 102 are maintained. This is to say, better reliability of the piezoelectric device 10 can be achieved due to the hydrogen blocking layer 104.

The method of forming the piezoelectric device 10 will be described in details below with reference to FIG. 3A to FIG. 3I. FIGS. 3A-3I are schematic cross-sectional views illustrating various stages of a method of forming the piezoelectric device in FIG. 1 and FIG. 2 in accordance with some embodiments.

Figure 3A:
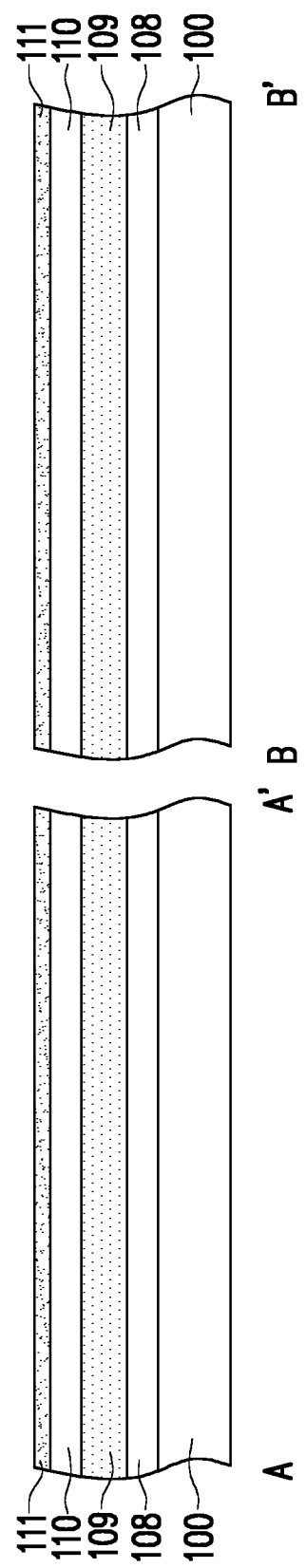
FIGS. 3A-3I are schematic cross-sectional views illustrating various stages of a method of forming the piezoelectric device in FIG. 1 and FIG. 2 in accordance with some embodiments.

Referring to FIG. 3A, a substrate 100 is provided. In some embodiments, the material of the substrate 100 may include, for example, silicon, glass, silicon dioxide, aluminum oxide, or the like. Referring to FIG. 3A, a first conductive layer 108, a piezoelectric material layer 109, a second conductive layer 110 and a first hydrogen blocking material layer 111 are sequentially formed on the substrate 100. In other words, the piezoelectric material layer 109 is located between the first conductive layer 108 and the second conductive layer 110, and the first hydrogen blocking material layer 111 is located on the second conductive layer 110. In some embodiments, the materials of the first conductive layer 108 and the second conductive layer 110 may respectively include, but not limited to, molybdenum (Mo), titanium nitride (TiN), aluminum (Al), platinum (Pt), gold (Au), tungsten (W), a combination thereof, or the like. In some embodiments, the material of the first conductive layer 108 is the same as the material of the second conductive layer 110. In some alternative embodiments, the material of the first conductive layer 108 is different from the material of the second conductive layer 110. In some embodiments, the first conductive layer 108 and the second conductive layer 110 each may has a thickness that is in a range from about 200 Å to about 2000 Å. In some embodiments, the first conductive layer 108 and the second conductive layer 110 each may be formed with a deposition process, such as chemical vapor deposition (CVD), physical vapor deposition (PVD), or atomic layer deposition (ALD).

In some embodiments, the material of the piezoelectric material layer 109 may include, but not limited to, aluminum nitride (AlN), lead zirconate titanate (PZT), gallium orthophosphate (GaPO$_4$), langasite (La$_3$Ga$_{0.5}$SiO$_{14}$), barium titanate (BaTiO$_3$), potassium niobate (KNbO$_3$), lithium niobate (LiNbO$_3$), lithium tantalate (LiTaO$_3$), sodium tungstate (Na$_2$WO$_3$), zinc oxide (ZnO), a combination thereof, or the like. In some embodiments, the piezoelectric material layer 109 may has a thickness that is in a range from about 2000 Å to about 20000 Å. In some embodiments, the piezoelectric material layer 109 may be formed with PVD or a sol-gel process.

In some embodiments, the material of the first hydrogen blocking material layer 111 may include a metal oxide. Examples of the metal oxide may include Al$_2$O$_3$, TiO$_2$, Fe$_2$O$_3$, ZrO$_2$, ZnO, CuO or Ta$_2$O$_5$. In some embodiments, the first hydrogen blocking material layer 111 may has a thickness that is greater than 200 Å. In detail, owing to having the thickness greater than 200 Å, the first hydrogen blocking layer 104a formed from the first hydrogen blocking material layer 111 has good blocking ability for hydrogen-ions. In some embodiments, the first hydrogen blocking material layer 111 may be formed with a deposition process, such as ALD or PVD. In detail, the first hydrogen blocking material layer 111 is formed with ALD, thereby the first hydrogen blocking material layer 111 is dense enough for the first hydrogen blocking layer 104a formed from the first hydrogen blocking material layer 111 to have good blocking ability for hydrogen-ions. Moreover, the first hydrogen blocking material layer 111 is formed with PVD, thereby there is no additional hydrogen-ions from the first hydrogen blocking material layer 111.

Figure 3B:
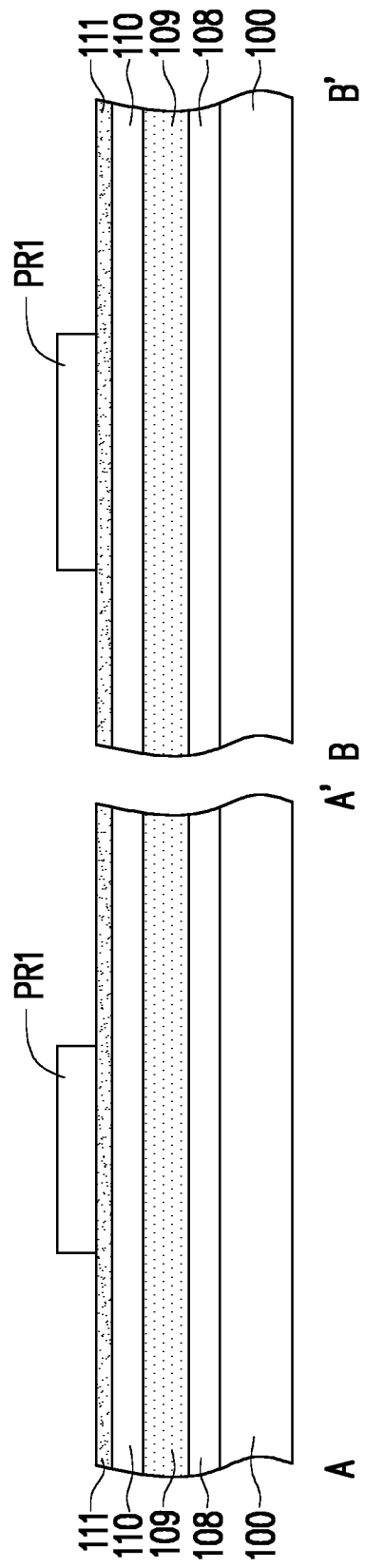

Referring to FIG. 3B, a first photolithography step is performed to form a first photoresist layer PR1 on the first hydrogen blocking material layer 111. In other words, the first hydrogen blocking material layer 111 is located between the first photoresist layer PR1 and the second conductive layer 110. In some embodiments, the first photolithography step for forming the first photoresist layer PR1 may include the following steps of coating a photoresist material on the first hydrogen blocking material layer 111, exposing the photoresist material with a photolithography mask (or called photomask), and developing the exposed photoresist material. In some embodiments, the first photoresist layer PR1 includes a positive photoresist material which is photo-solubilized when exposed to light. In some alternative embodiments, the first photoresist layer PR1 includes a negative photoresist material.

Figure 3C:
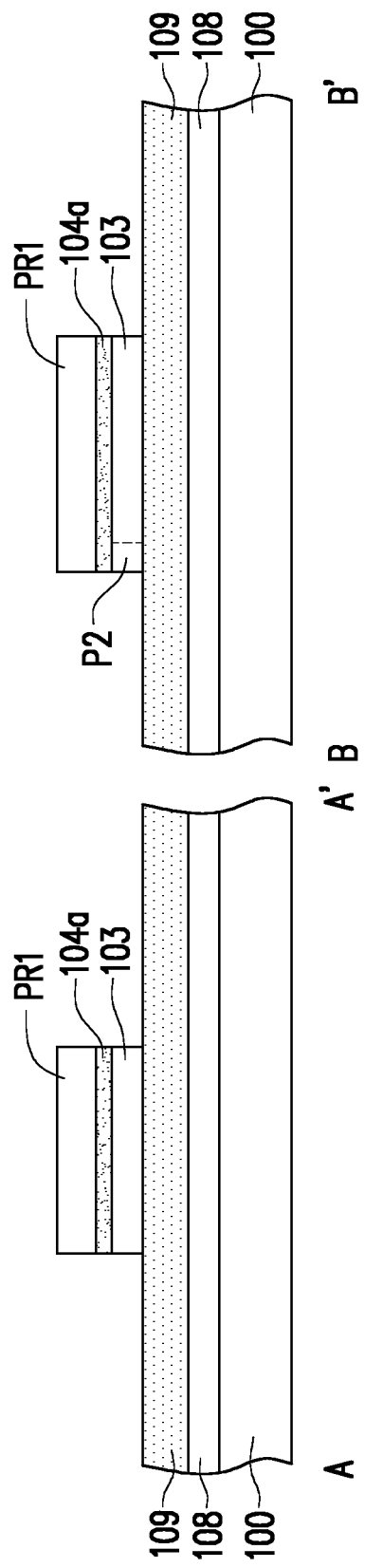

Referring to FIG. 3B and FIG. 3C, a first etching step is performed to the first hydrogen blocking material layer 111 and the second conductive layer 110 by using the first photoresist layer PR1 as an etch mask, such that the first hydrogen blocking material layer 111 and the second conductive layer 110 are etched to form the first hydrogen blocking layer 104a and the second electrode 103, and the portions of the piezoelectric material layer 109 that are not covered by the first hydrogen blocking layer 104a and the second electrode 103 are exposed. In other words, the first hydrogen blocking material layer 111 and the second conductive layer 110 are simultaneously patterned by using the same mask to form the first hydrogen blocking layer 104a and the second electrode 103. That is to say, the first hydrogen blocking layer 104a and the second electrode 103 have substantially identical layout. In some embodiments, the first etching step is an ion-beam etching step used to pattern the first hydrogen blocking material layer 111 and the second conductive layer 110 in a single patterning process. In some embodiments, during the ion-beam etching step, there is substantially no etching selectivity between the first hydrogen blocking material layer 111 and the second conductive layer 110, which means that the etching rate ratio of the material of the first hydrogen blocking material layer 111 to the material of the second conductive layer 110 is substantially 1. It is noted that, as the first hydrogen blocking material layer 111 is formed between the first photoresist layer PR1 and the second conductive layer 110, during the first etching step, the first hydrogen blocking layer 104a helps prevent the hydrogen-ions in the first photoresist layer PR1 from penetrating into the second electrode 103.

As shown in FIG. 3C, the first hydrogen blocking layer 104a is located between the first photoresist layer PR1 and the second electrode 103. From another point of view, the first hydrogen blocking layer 104a is formed to physically contact the second electrode 103 at the top surface of the second electrode 103. Details of the first hydrogen blocking layer 104a and the second electrode 103 have been described above, and will not be iterated herein.

Figure 3D:
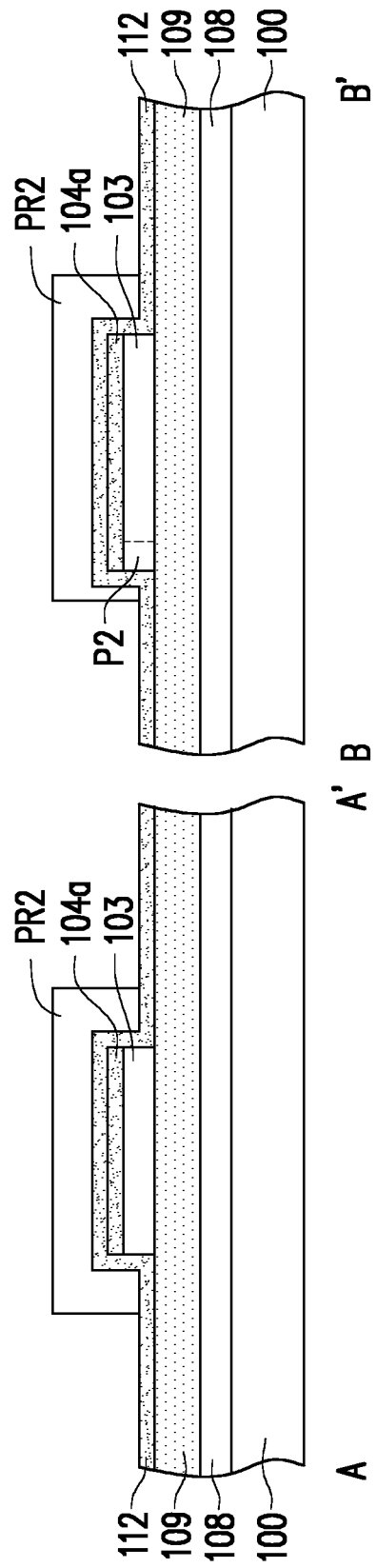

Referring to FIG. 3C and FIG. 3D, after the first hydrogen blocking layer 104a and the second electrode 103 are formed, the first photoresist layer PR1 is removed. In some embodiments, the first photoresist layer PR1 may be removed by a stripping process, such as a dry stripping process, a wet stripping process or a combination thereof. As mentioned above, since the first hydrogen blocking layer 104a is located between the first photoresist layer PR1 and the second electrode 103, during the stripping process of the first photoresist layer PR1, the first hydrogen blocking layer 104a helps prevent the hydrogen-ions in the first photoresist layer PR1 from penetrating into the second electrode 103.

Still referring to FIG. 3D, a second hydrogen blocking material layer 112 is formed on the first hydrogen blocking layer 104a and the second electrode 103. In addition, the second hydrogen blocking material layer 112 is formed on the portions of the piezoelectric material layer 109 that are not covered by the first hydrogen blocking layer 104a and the second electrode 103. In some embodiments, the second hydrogen blocking material layer 112 is a conformal layer. In detail, the second hydrogen blocking material layer 112 conformally and completely covers the top surface and the sidewall of the first hydrogen blocking layer 104a, the sidewall of the second electrode 103, and the portions of the piezoelectric material layer 109 that are not covered by the first hydrogen blocking layer 104a and the second electrode 103. However, the disclosure is not limited thereto. In some alternative embodiments, the second hydrogen blocking material layer 112 is not a conformal layer.

In some embodiments, the material of the second hydrogen blocking material layer 112 may include a metal oxide. Examples of the metal oxide may include Al$_2$O$_3$, TiO$_2$, Fe$_2$O$_3$, ZrO$_2$, ZnO, CuO or Ta$_2$O$_5$. In some embodiments, the material of the second hydrogen blocking material layer 112 is the same as the material of the first hydrogen blocking material layer 111. In some alternative embodiments, the material of the second hydrogen blocking material layer 112 is different from the material of the first hydrogen blocking material layer 111.

In some embodiments, the second hydrogen blocking material layer 112 may has a thickness that is greater than 200 Å. In detail, owing to having the thickness greater than 200 Å, the second hydrogen blocking layer 104b formed from the second hydrogen blocking material layer 112 has good blocking ability for hydrogen-ions. In some embodiments, the thickness of the second hydrogen blocking material layer 112 is the same as the thickness of the first hydrogen blocking material layer 111. In some alternative embodiments, the thickness of the second hydrogen blocking material layer 112 is different from the thickness of the first hydrogen blocking material layer 111.

In some embodiments, the second hydrogen blocking material layer 112 may be formed with a deposition process, such as ALD or PVD. In detail, the second hydrogen blocking material layer 112 is formed with ALD, thereby the second hydrogen blocking material layer 112 is dense enough for the second hydrogen blocking layer 104b formed from the second hydrogen blocking material layer 112 to have good blocking ability for hydrogen-ions. Moreover, the second hydrogen blocking material layer 112 is formed with PVD, thereby there is no additional hydrogen-ions from the second hydrogen blocking material layer 112.

Continue referring to FIG. 3D, a second photolithography step is performed to form a second photoresist layer PR2 on the second hydrogen blocking material layer 112. In other words, the second hydrogen blocking material layer 112 is located between the second photoresist layer PR2 and the second electrode 103, and between the second photoresist layer PR2 and the piezoelectric material layer 109. In some embodiments, the second photolithography step for forming the second photoresist layer PR2 may include the following steps of coating a photoresist material on the second hydrogen blocking material layer 112, exposing the photoresist material with a photolithography mask (or called photomask), and developing the exposed photoresist material. In some embodiments, the second photoresist layer PR2 includes a positive photoresist material which is photo-solubilized when exposed to light. In some alternative embodiments, the second photoresist layer PR2 includes a negative photoresist material.

Figure 3E:
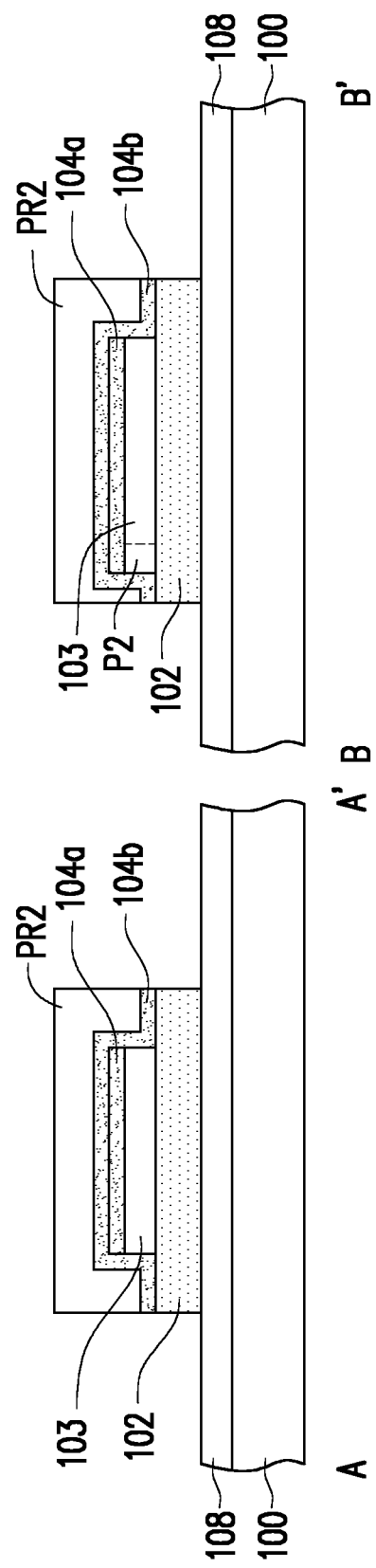

Referring to FIG. 3D and FIG. 3E, a second etching step is performed to the second hydrogen blocking material layer 112 and the piezoelectric material layer 109 by using the second photoresist layer PR2 as an etch mask, such that the second hydrogen blocking material layer 112 and the piezoelectric material layer 109 are etched to form the second hydrogen blocking layer 104b and the piezoelectric layer 102, and the portions of the first conductive layer 108 that are not covered by the second hydrogen blocking layer 104b and the piezoelectric layer 102 are exposed. In other words, the second hydrogen blocking material layer 112 and the piezoelectric material layer 109 are simultaneously patterned by using the same mask to form the second hydrogen blocking layer 104b and the piezoelectric layer 102. That is to say, the second hydrogen blocking layer 104b and the piezoelectric layer 102 have substantially identical layout. In some embodiments, the second etching step is an ion-beam etching step used to pattern the second hydrogen blocking material layer 112 and the piezoelectric material layer 109 in a single patterning process. In detail, in some embodiments, during the ion-beam etching step, there is substantially no etching selectivity between the second hydrogen blocking material layer 112 and the piezoelectric material layer 109, which means that the etching rate ratio of the material of the second hydrogen blocking material layer 112 to the material of the piezoelectric material layer 109 is substantially 1. It is noted that, as the second hydrogen blocking material layer 112 is formed between the second photoresist layer PR2 and the second electrode 103, and between the second photoresist layer PR2 and the piezoelectric material layer 109, during the second etching step, the hydrogen-ions in the second photoresist layer PR2 are barred from penetrating into the second electrode 103 and the piezoelectric layer 102 by the second hydrogen blocking layer 104b.

As shown in FIG. 3E, the second hydrogen blocking layer 104b is located between the second photoresist layer PR2 and the first hydrogen blocking layer 104a, between the second photoresist layer PR2 and the second electrode 103, and between the second photoresist layer PR2 and the piezoelectric layer 102. In detail, the second hydrogen blocking layer 104b is formed to physically contact the first hydrogen blocking layer 104a at the top surface and the sidewall of the first hydrogen blocking layer 104a, physically contact the second electrode 103 at the sidewall of the second electrode 103, and physically contact the piezoelectric layer 102 at the top surface of the piezoelectric layer 102. In addition, as shown in the cross-section of FIG. 3E, the sidewall of the piezoelectric layer 102 is laterally shifted from the sidewall of the second electrode 103. In detail, the sidewall of the piezoelectric layer 102 is laterally shifted outward from the sidewall of the second electrode 103. In other words, in the cross-section of FIG. 3E, the width of the piezoelectric layer 102 is greater than the width of the second electrode 103. Specifically, as shown in the cross-section of FIG. 3E, the second electrode 103 and the piezoelectric layer 102 constitute a stacked structure having stepped sidewalls at both sides. Moreover, as shown in FIG. 3E, the second electrode 103 covers a part of the piezoelectric layer 102, thereby the top surface of the piezoelectric layer 102 which is contacted with the second hydrogen blocking layer 104b is uncovered by the second electrode 103. From another point of view, as from the top view of FIG. 1, the boundary of the second electrode 103 is within the boundary of the piezoelectric layer 102. The other details of the second hydrogen blocking layer 104b and the piezoelectric layer 102 have been described above, and will not iterated herein.

Figure 3F:
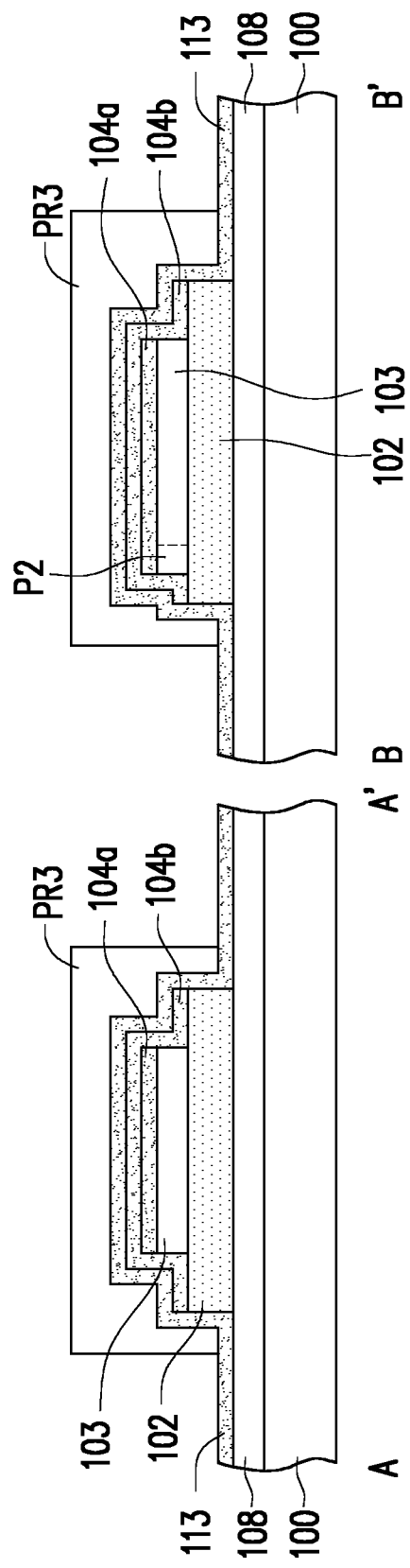

Referring to FIG. 3E and FIG. 3F, after the second hydrogen blocking layer 104b and the piezoelectric layer 102 are formed, the second photoresist layer PR2 is removed. In some embodiments, the second photoresist layer PR2 may be removed by a stripping process, such as a dry stripping process, a wet stripping process or a combination thereof. As mentioned above, since the second hydrogen blocking layer 104b is located between the second photoresist layer PR2 and the second electrode 103, and between the second photoresist layer PR2 and the piezoelectric layer 102, during the stripping process of the second photoresist layer PR2, the second hydrogen blocking layer 104b helps prevent the hydrogen-ions in the second photoresist layer PR2 from penetrating into the second electrode 103 and the piezoelectric layer 102.

Still referring to FIG. 3F, a third hydrogen blocking material layer 113 is formed on the second hydrogen blocking layer 104b and the piezoelectric layer 102. In addition, the third hydrogen blocking material layer 113 is formed on the portions of the first conductive layer 108 that are not covered by the second hydrogen blocking layer 104b and the piezoelectric layer 102. In some embodiments, the third hydrogen blocking material layer 113 is a conformal layer. In detail, the third hydrogen blocking material layer 113 conformally and completely covers the top surface and the sidewall of the second hydrogen blocking layer 104b, the sidewall of the piezoelectric layer 102, and the portions of the first conductive layer 108 that are not covered by the second hydrogen blocking layer 104b and the piezoelectric layer 102. However, the disclosure is not limited thereto. In some alternative embodiments, the third hydrogen blocking material layer 113 is not a conformal layer.

In some embodiments, the material of the third hydrogen blocking material layer 113 may include a metal oxide. Examples of the metal oxide may include $Al_2O_3$, $TiO_2$, $Fe_2O_3$, $ZrO_2$, ZnO, CuO or $Ta_2O_5$. In some embodiments, the material of the third hydrogen blocking material layer 113 is the same as the material of the second hydrogen blocking material layer 112 and the material of the first hydrogen blocking material layer 111. In some alternative embodiments, the material of the third hydrogen blocking material layer 113 is different from at least one of the material of the second hydrogen blocking material layer 112 and the material of the first hydrogen blocking material layer 111. That is to say, the material of the third hydrogen blocking material layer 113 and the material of the second hydrogen blocking material layer 112 are the same or not the same, and the material of the third hydrogen blocking material layer 113 and the material of the first hydrogen blocking material layer 111 are the same or not the same.

In some embodiments, the third hydrogen blocking material layer 113 may has a thickness that is greater than 200 Å. In detail, owing to having the thickness greater than 200 Å, the third hydrogen blocking layer 104c formed from the third hydrogen blocking material layer 113 has good blocking ability for hydrogen-ions. In some embodiments, the thickness of the third hydrogen blocking material layer 113 is the same as the thickness of the second hydrogen blocking material layer 112 and the thickness of the first hydrogen blocking material layer 111. In some alternative embodiments, the thickness of the third hydrogen blocking material layer 113 is different from at least one of the thickness of the second hydrogen blocking material layer 112 and the thickness of the first hydrogen blocking material layer 111. That is to say, the thickness of the third hydrogen blocking material layer 113 and the thickness of the second hydrogen blocking material layer 112 are the same or not the same, and the thickness of the third hydrogen blocking material layer 113 and the thickness of the first hydrogen blocking material layer 111 are the same or not the same.

In some embodiments, the third hydrogen blocking material layer 113 may be formed with a deposition process, such as ALD or PVD. In detail, the third hydrogen blocking material layer 113 is formed with ALD, thereby the third hydrogen blocking material layer 113 is dense enough for the third hydrogen blocking layer 104c formed from the third hydrogen blocking material layer 113 to have good blocking ability for hydrogen-ions. Moreover, the third hydrogen blocking material layer 113 is formed with PVD, thereby there is no additional hydrogen-ions from the third hydrogen blocking material layer 113.

Continue referring to FIG. 3F, a third photolithography step is performed to form a third photoresist layer PR3 on the third hydrogen blocking material layer 113. In other words, the third hydrogen blocking material layer 113 is located between the third photoresist layer PR3 and the piezoelectric layer 102, and between the third photoresist layer PR3 and the first conductive layer 108. In some embodiments, the third photolithography step for forming the third photoresist layer PR3 may include the following steps of coating a photoresist material on the third hydrogen blocking material layer 113, exposing the photoresist material with a photolithography mask (or called photomask), and developing the exposed photoresist material. In some embodiments, the third photoresist layer PR3 includes a positive photoresist material which is photo-solubilized when exposed to light. In some alternative embodiments, the third photoresist layer PR3 includes a negative photoresist material.

Figure 3G:
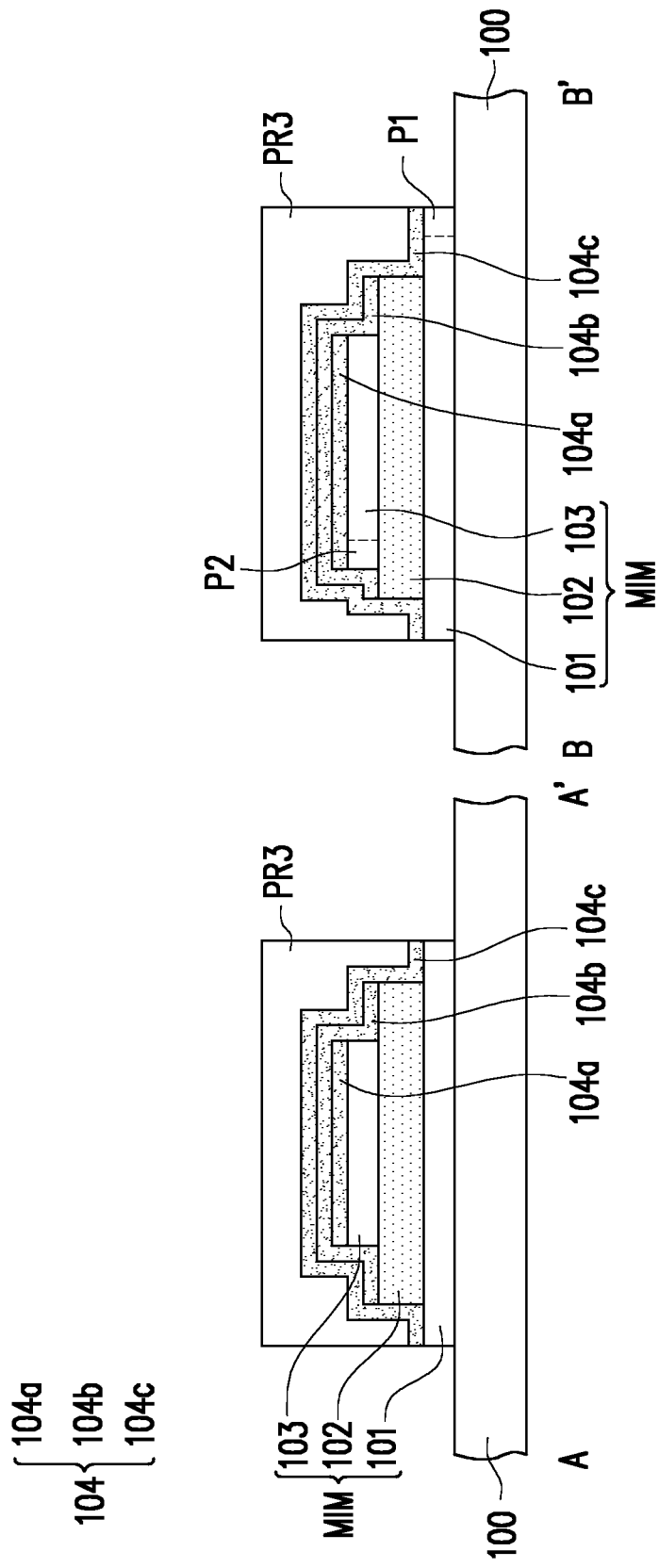

Referring to FIG. 3F and FIG. 3G, a third etching step is performed to the third hydrogen blocking material layer 113 and the first conductive layer 108 by using the third photoresist layer PR3 as an etch mask, such that the third hydrogen blocking material layer 113 and the first conductive layer 108 are etched to form the third hydrogen blocking layer 104c and the first electrode 101, and the portions of the substrate 100 that are not covered by the third hydrogen blocking layer 104c and the first electrode 101 are exposed. In other words, the third hydrogen blocking material layer 113 and the first conductive layer 108 are simultaneously patterned by using the same mask to form the third hydrogen blocking layer 104c and the first electrode 101. That is to say, the third hydrogen blocking layer 104c and the first electrode 101 have substantially identical layout. In some embodiments, the third etching step is an ion-beam etching step used to pattern the third hydrogen blocking material layer 113 and the first conductive layer 108 in a single patterning process. In detail, in some embodiments, during the ion-beam etching step, there is substantially no etching selectivity between the third hydrogen blocking material layer 113 and the first conductive layer 108, which means that the etching rate ratio of the material of the third hydrogen blocking material layer 113 to the material of the first conductive layer 108 is substantially 1. It is noted that, as the third hydrogen blocking material layer 113 is formed between the third photoresist layer PR3 and the piezoelectric layer 102, and between the third photoresist layer PR3 and the first conductive layer 108, during the third etching step, the third hydrogen blocking layer 104c helps prevent the hydrogen-ions in the third photoresist layer PR3 from penetrating into the piezoelectric layer 102 and the first electrode 101.

As shown in FIG. 3G, the third hydrogen blocking layer 104c is located between the third photoresist layer PR3 and the second hydrogen blocking layer 104b, between the third photoresist layer PR3 and the piezoelectric layer 102, and between the third photoresist layer PR3 and the first electrode 101. In detail, the third hydrogen blocking layer 104c is formed to physically contact the second hydrogen blocking layer 104b at the top surface and the sidewall of the second hydrogen blocking layer 104b, physically contact the piezoelectric layer 102 at the sidewall of the piezoelectric layer 102, and physically contact the first electrode 101 at the top surface of the first electrode 101. In addition, as shown in the cross-section of FIG. 3G, the sidewall of the first electrode 101 is laterally shifted from the sidewall of the piezoelectric layer 102. In detail, the sidewall of the first electrode 101 is laterally shifted outward from the sidewall of the piezoelectric layer 102. In other words, in the cross-section of FIG. 3G, the width of the first electrode 101 is greater than the width of the piezoelectric layer 102. Specifically, as shown in the cross-section of FIG. 3G, the piezoelectric layer 102 and the first electrode 101 constitute a stacked structure having stepped sidewalls at both sides. Moreover, as shown in FIG. 3G, the piezoelectric layer 102 covers a part of the first electrode 101, thereby the top surface of the first electrode 101 which is contacted with the third hydrogen blocking layer 104c is uncovered by the piezoelectric layer 102. From another point of view, as from the top view of FIG. 1, the boundary of the piezoelectric layer 102 is within the boundary of the first electrode 101. The other details of the third hydrogen blocking layer 104c and the first electrode 101 have been described above, and will not iterated herein.

After the first electrode 101 is formed, the formation of the metal-insulator-metal element MIM comprising the first electrode 101, the piezoelectric layer 102 and the second electrode 103 is thus completed. In detail, as mentioned above, since the second electrode 103 and the piezoelectric layer 102 are formed to constitute a stacked structure having stepped sidewalls at both sides, and the piezoelectric layer 102 and the first electrode 101 are also formed to constitute a stacked structure having stepped sidewalls at both sides, the metal-insulator-metal element MIM comprising the first electrode 101, the piezoelectric layer 102 and the second electrode 103 has a staircase shaped stacked-structure, as shown in the cross-section of FIG. 3G.

Furthermore, after the third hydrogen blocking layer 104c is formed, the formation of the hydrogen blocking layer 104 comprising the first hydrogen blocking layer 104a, the second hydrogen blocking layer 104b and the third hydrogen blocking layer 104c is thus completed. As shown in FIG. 3G, the hydrogen blocking layer 104 covers and contacts the top surface of the second electrode 103, and contacts a part of the top surface of the first electrode 101 and a part of the top surface of the piezoelectric layer 102. In detail, the hydrogen blocking layer 104 physically contacts the metal-insulator-metal element MIM at the top surface and the sidewall of the second electrode 103, the sidewall and a part of the top surface of the piezoelectric layer 102, and a part of the top surface of the first electrode 101. Moreover, as shown in FIG. 3G, the thickness of the hydrogen blocking layer 104 that is located on and contacts the top surface of the second electrode 103 is greater than the thickness of the hydrogen blocking layer 104 that is located on and contacts the top surface of the piezoelectric layer 102, and the thickness of the hydrogen blocking layer 104 that is located on and contacts the top surface of the piezoelectric layer 102 is greater than the thickness of the hydrogen blocking layer 104 that is located on and contacts the top surface of the first electrode 101.

Figure 3H:
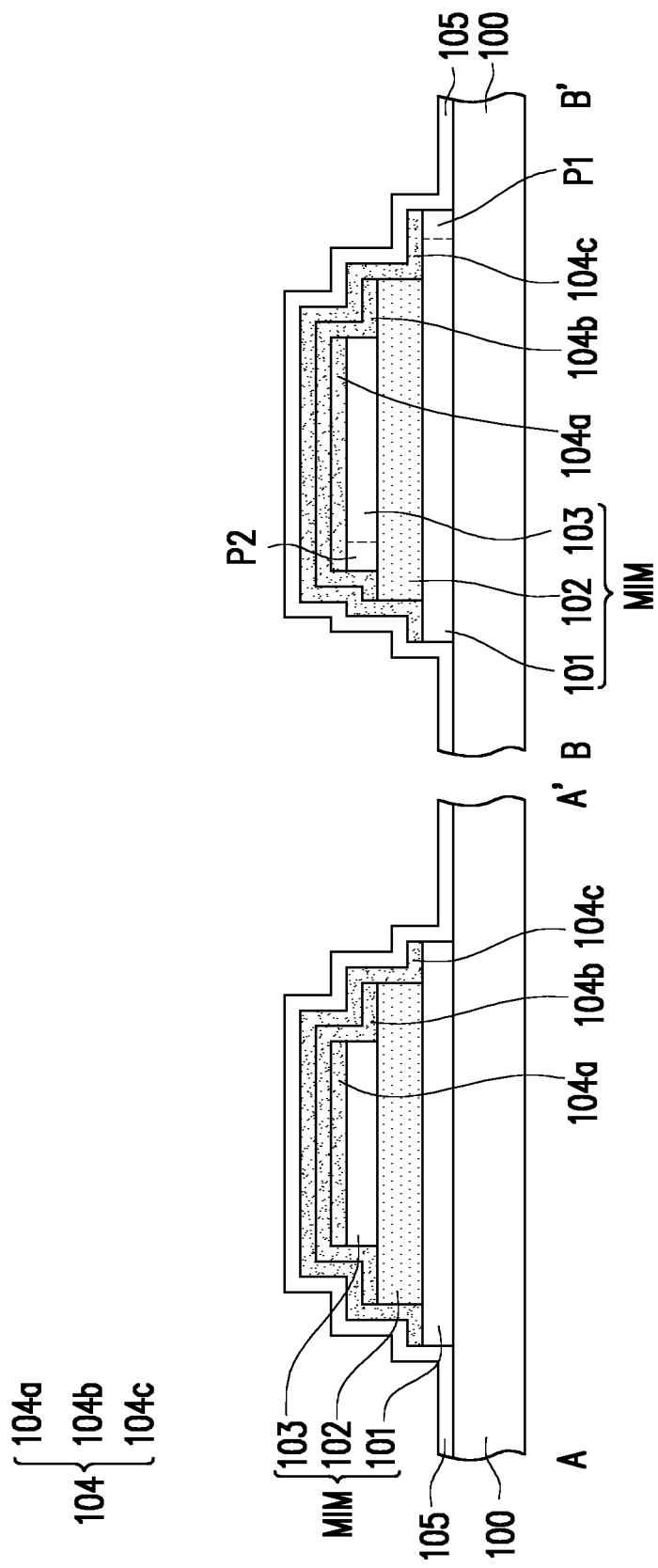

Referring to FIG. 3G and FIG. 3H, after the third hydrogen blocking layer 104c and the first electrode 101 are formed, the third photoresist layer PR3 is removed. In some embodiments, the third photoresist layer PR3 may be removed by a stripping process, such as a dry stripping process, a wet stripping process or a combination thereof. As mentioned above, since the third hydrogen blocking layer 104c is located between the third photoresist layer PR3 and the piezoelectric layer 102, and between the third photoresist layer PR3 and the first electrode 101, during the stripping process of the third photoresist layer PR3, the third hydrogen blocking layer 104c helps prevent the hydrogen-ions in the third photoresist layer PR3 from penetrating into the piezoelectric layer 102 and the first electrode 101.

Still referring to FIG. 3H, a passivation layer 105 is formed to cover the hydrogen blocking layer 104 and the metal-insulator-metal element MIM. In some embodiments, the passivation layer 105 may be formed with CVD, PVD, or any other suitable techniques. In some embodiments, the material of the passivation layer 105 may be a dielectric material, such as silicon oxide, silicon nitride, silicon oxynitride or a combination thereof. In some embodiments, the passivation layer 105 may has a thickness that is in a range from about 200 Å to about 2000 Å. Details of the passivation layer 105 have been described above, and will not iterated herein.

Figure 3I:
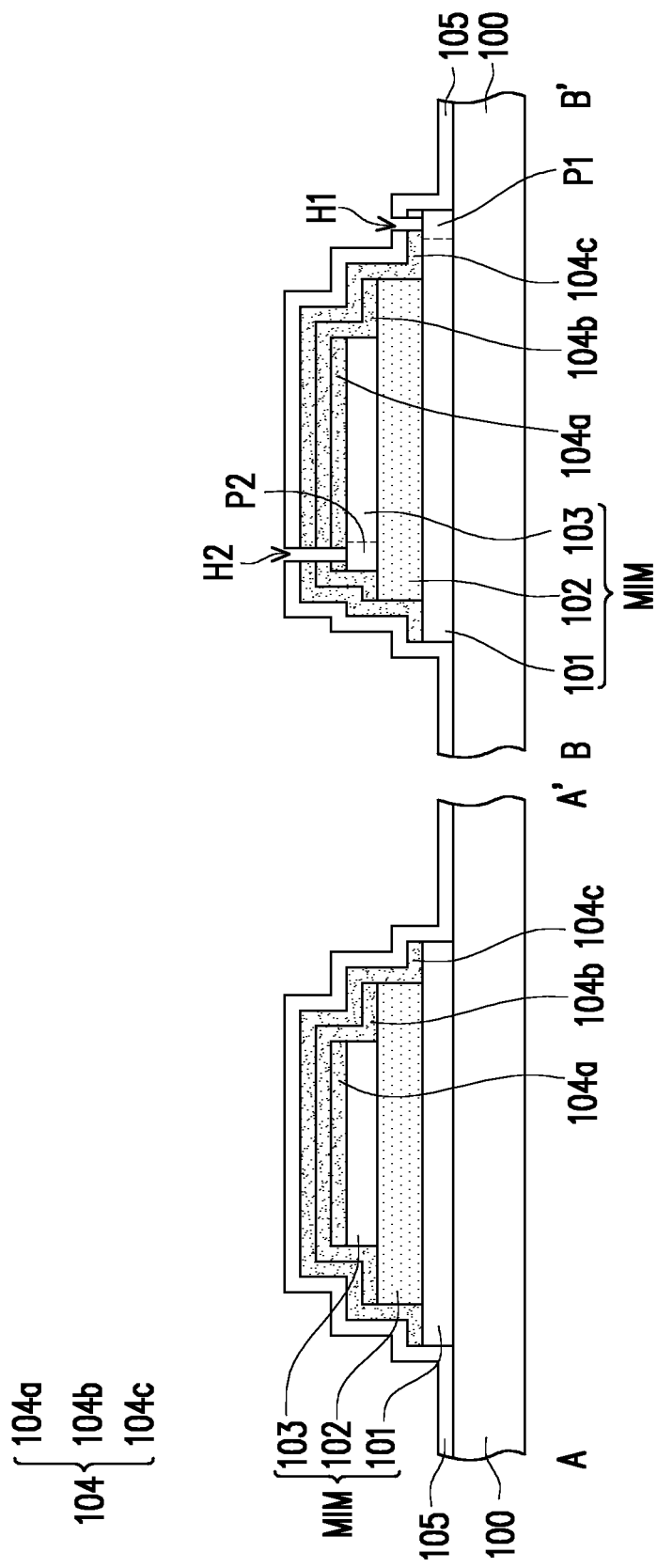

Referring to FIG. 3H and FIG. 3I, the passivation layer 105 and the hydrogen blocking layer 104 are patterned to form a first contact hole H1 and a second contact hole H2 for exposing a contact portion P1 of the first electrode 101 and a contact portion P2 of the second electrode 103. In detail, as shown in FIG. 3I, the first contact hole H1 is formed in the passivation layer 105 and the third hydrogen blocking layer 104c, and the second contact hole H2 is formed in the passivation layer 105, the first hydrogen blocking layer 104a, the second hydrogen blocking layer 104b and the third hydrogen blocking layer 104c. In some embodiments, the first contact hole H1 and the second contact hole H2 may be formed by performing photolithography and etching processes.

Then, referring back to FIG. 2, a first contact terminal 106 is formed on the passivation layer 105 to be electrically connected to the first electrode 101 through the first contact hole H1, and a second contact terminal 107 is formed on the passivation layer 105 to be electrically connected to the second electrode 103 through the second contact hole H2. In detail, the first contact terminal 106 is formed to be electrically connected to the contact portion P1 of the first electrode 101, and the second contact terminal 107 is formed to be electrically connected to the contact portion P2 of the second electrode 103. In some embodiments, the materials of the first contact terminal 106 and the second contact terminal 107 may respectively include, but not limited to, silver (Ag), titanium (Ti), tantalum (Ta), ruthenium (Ru), aluminum (Al), copper (Cu), gold (Au), or a combination thereof, or the like. So far, the manufacture of the piezoelectric device 10 according to some embodiments is completed. The first contact terminal 106 and the second contact terminal 107 provide the input/output terminals for receiving the electrical voltage for controlling the physical displacement of the piezoelectric device 10. Details of the first contact terminal 106 and the second contact terminal 107 have been described above, and will not iterated herein.

In the above-mentioned embodiments shown in FIG. 3A to FIG. 3I, since before each photoresist layer utilized as an etch mask for forming the metal-insulator-metal element MIM (i.e., the first photoresist layer PR1, the second photoresist layer PR2, the third photoresist layer PR3) is formed, the corresponding hydrogen blocking material layer (i.e., the first hydrogen blocking material layer 111, the second hydrogen blocking material layer 112, the third hydrogen blocking material layer 113) is already formed, the hydrogen-ions in the photoresist layer are barred from penetrating into the metal-insulator-metal element MIM during the etching process and the striping process by the corresponding hydrogen blocking material layer. From another point of view, since the hydrogen blocking layer 104 includes the first hydrogen blocking layer 104a, the second hydrogen blocking layer 104b and the third hydrogen blocking layer 104c, the first hydrogen blocking layer 104a is formed to covers and contacts the top surface of the second electrode 103, the second hydrogen blocking layer 104b is formed to covers the second electrode 103 and contacts the top surface of the piezoelectric layer 102, and the third hydrogen blocking layer 104c is formed to covers the second electrode 103 and the piezoelectric layer 102 and contacts the top surface of the first electrode 101, during the manufacture of the piezoelectric device 10, each of the first hydrogen blocking layer 104a, the second hydrogen blocking layer 104b and the third hydrogen blocking layer 104c helps prevent the hydrogen-ions of the photoresist layer from penetrating into the metal-insulator-metal element MIM. Based on the above discussion, it is noted that owing to arranging the hydrogen blocking layer 104, the amount of the hydrogen-ions existing in the metal-insulator-metal element MIM of the piezoelectric device 10 can be reduced, and the reliability of the piezoelectric device 10 can be improved.

When compared with the piezoelectric device without the hydrogen blocking layer, due to the arrangement of the additional hydrogen blocking layer, the amount of the hydrogen-ions included in the metal-insulator-metal element MIM of the piezoelectric device is reduced by about 50%.

Moreover, during the reliability test under the same conditions, when compared with the failure rate of more than 50% for the piezoelectric device without the hydrogen blocking layer, the piezoelectric device designed with at least one additional hydrogen blocking layer based on certain previous embodiments has a failure rate approaching zero. Furthermore, the piezoelectric device designed with at least one additional hydrogen blocking layer based on certain previous embodiments offers a higher breakdown voltage. When compared with the piezoelectric device without the hydrogen blocking layer, a breakdown voltage difference equal to or greater than 20V can be observed. Based on the above results, through the arrangement of the hydrogen blocking layer in the piezoelectric device, the performance and reliability of the piezoelectric device can be significantly improved.

In the embodiments of FIG. 1 and FIG. 2, the metal-insulator-metal element MIM has a staircase shaped stacked-structure. However, the disclosure is not limited thereto. Possible modifications and alterations may be made to the configuration of the metal-insulator-metal element MIM. Such modifications and alterations will be described below with reference to FIG. 4 and FIG. 5, which are provided for illustration purposes, and are not construed as limiting the present disclosure.

Figure 4:
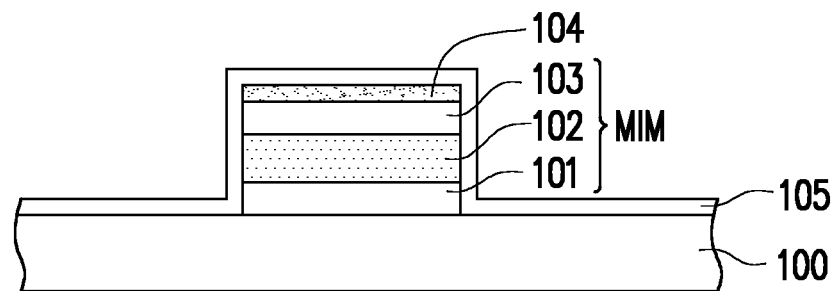
FIG. 4 is a schematic cross-sectional view illustrating a piezoelectric device in accordance with alternative embodiments.

FIG. 4 is a schematic cross-sectional view illustrating a piezoelectric device in accordance with alternative embodiments. Referring to FIG. 4 and FIG. 2, the piezoelectric device 20a of FIG. 4 is similar to the piezoelectric device 10 of FIG. 2 that taken along line A-A', hence the same reference numerals are used to refer to the same or liked parts, and its detailed description will be omitted herein. The differences between the piezoelectric device 20a and the piezoelectric device 10 will be described below.

Referring to FIG. 4, in the piezoelectric device 20a, the sidewalls of the first electrode 101, the piezoelectric layer 102 and the second electrode 103 are vertically aligned. Further, as shown in FIG. 4, the sidewall of the hydrogen blocking layer 104 is vertically aligned with the sidewalls of the first electrode 101, the piezoelectric layer 102 and the second electrode 103. From another point of view, in the piezoelectric device 20a, the hydrogen blocking layer 104 is disposed right above the second electrode 103 and physically contacts the metal-insulator-metal element MIM at the top surface of the second electrode 103. In detail, as shown in FIG. 4, the hydrogen blocking layer 104 physically contacts the second electrode 103 at the top surface of the second electrode 103, and does not physically contact the piezoelectric layer 102 and the first electrode 101. In some embodiments, as shown in FIG. 4, the hydrogen blocking layer 104 is a single layer. However, the disclosure is not limited thereto. In some alternative embodiments, the hydrogen blocking layer 104 of the piezoelectric device 20a is a multilayer structure.

Figure 5:
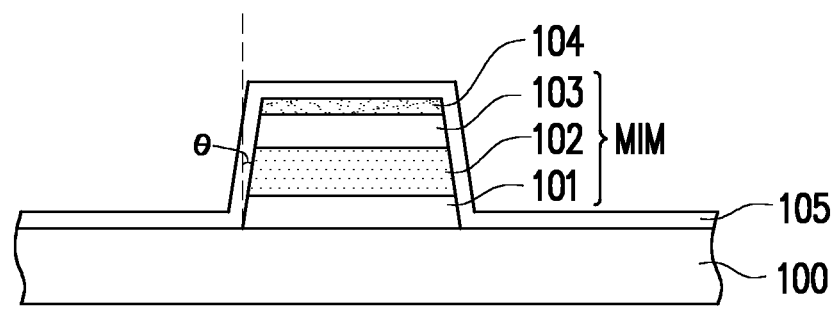
FIG. 5 is a schematic cross-sectional view illustrating a piezoelectric device in accordance with alternative embodiments.

FIG. 5 is a schematic cross-sectional view illustrating a piezoelectric device in accordance with alternative embodiments. Referring to FIG. 5 and FIG. 4, the piezoelectric device 20b of FIG. 5 is similar to the piezoelectric device 20a of FIG. 4, and the main difference between them lies in that, in the piezoelectric device 20b, the sidewalls of the first electrode 101, the piezoelectric layer 102 and the second electrode 103 are tilted sidewalls; while in the piezoelectric device 20a, the sidewalls of the first electrode 101, the piezoelectric layer 102 and the second electrode 103 are vertically aligned. That is to say, in the piezoelectric device 20b, the metal-insulator-metal element MIM has a taper profile. Further, as shown in FIG. 5, the sidewall of the hydrogen blocking layer 104 is also a tilted sidewall. In some embodiments, an angle θ between the tilted sidewall of each of the first electrode 101, the piezoelectric layer 102, the second electrode 103 and the hydrogen blocking layer 104 and the normal direction (illustrated by a dash line shown in FIG. 5) of the substrate 100 may range from greater than 0° to about 40°. In some embodiments, the method of forming the metal-insulator-metal element MIM having a taper profile of the piezoelectric device 20b may include the step of adjusting the incidence angle of the ion beam during the ion-beam etching step with respect to the normal direction of the substrate 100.

Figure 6A:
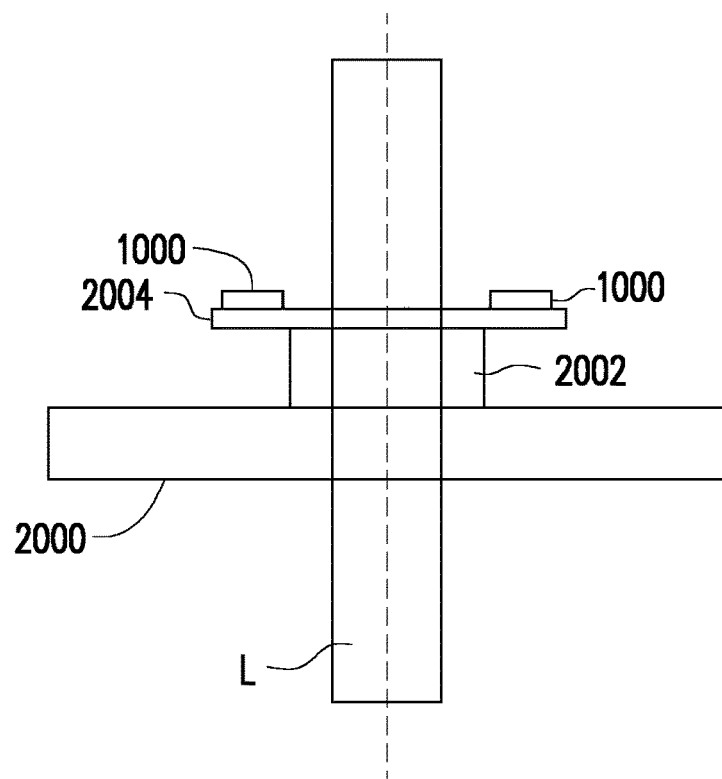
FIG. 6A and FIG. 6B are schematic views illustrating one exemplary application of the piezoelectric device in accordance with some embodiments.
Figure 6B:
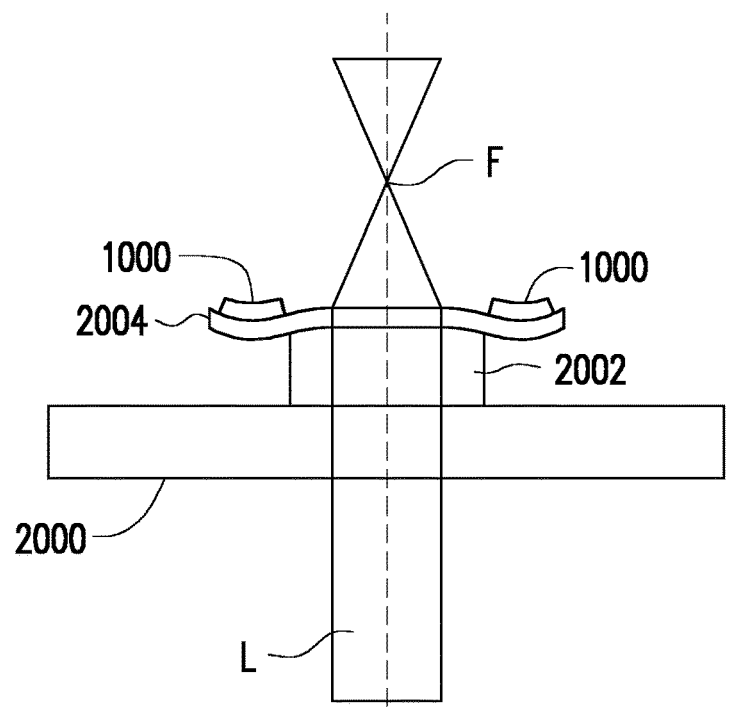

FIG. 6A and FIG. 6B are schematic views illustrating one exemplary application of the piezoelectric device in accordance with some embodiments. Referring to FIG. 6A and FIG. 6B, two piezoelectric devices 1000 are used for controlling a variable focus optical system. It is noted that the piezoelectric device 1000 may be implemented by using the piezoelectric device 10, piezoelectric device 20a or piezoelectric device 20b in the above-mentioned embodiments. Moreover, the number and the type(s) of the piezoelectric devices 1000 illustrated in FIG. 6A and FIG. 6B are merely for illustrative purposes, and the disclosure is not limited thereto. In some alternative embodiments, one piezoelectric device 1000 or more than two piezoelectric devices 1000 may be used for controlling a variable focus optical system.

As shown in FIG. 6A and FIG. 6B, the variable focus optical system includes a glass carrier 2000, a glass thin membrane 2004 and a transparent polymer 2002. The piezoelectric devices 1000 are disposed on the glass thin membrane 2004. The transparent polymer 2002 with well-defined optical index may be used to fill up the space between the glass carrier 2000 and the glass thin membrane 2004. As mentioned above, when a voltage is applied to the piezoelectric devices 1000, the piezoelectric layer of each piezoelectric device 1000 can stretch or compress to provide a physical displacement in a direction normal to the surface of the glass thin membrane 2004. As a result, each piezoelectric device 1000 forces the glass thin membrane 2004 so as to change the position of the glass thin membrane 2004 and/or the shape of the glass thin membrane 2004. That is, the piezoelectric device 1000 may function as an actuator. As shown in FIG. 6B, the piezoelectric devices 1000 force the glass thin membrane 2004 to bend accordingly. At this time, a beam of light L, after passing through the glass carrier 2000, the transparent polymer 2002 and the glass thin membrane 2004, gets focused at a focus point F, as shown in FIG. 6B. It is noted that since the amount of the physical displacement generally depends upon the voltage applied to the piezoelectric device, by adjusting the magnitude of the applied voltage, the position of the focus point F will change. Furthermore, when the piezoelectric devices 1000 are in standby mode, no force is applied to the glass thin membrane 2004, thereby a beam of light L passes through the glass carrier 2000, the transparent polymer 2002 and the glass thin membrane 2004 without deviation, as shown in FIG. 6A.

In some embodiments, the variable focus optical system may be comprised within a package of a semiconductor chip having one or more image sensors. For example, in some embodiments, the variable focus optical system may be configured to focus light onto an integrated chip having one or more image sensing devices (e.g., CMOS image sensors, CCD image sensors). It will be appreciated that the variable focus optical system shown in FIG. 6A and FIG. 6B is merely one example showing possible applications of the piezoelectric device 1000. People skilled in the art can understand other possible applications of the piezoelectric device 1000.

In accordance with some embodiments of the present disclosure, a piezoelectric device including a substrate, a metal-insulator-metal element, a hydrogen blocking layer, a passivation layer, a first contact terminal and a second contact terminal is provided. The metal-insulator-metal element is disposed on the substrate. The hydrogen blocking layer is disposed on the metal-insulator-metal element. The passivation layer covers the hydrogen blocking layer and the metal-insulator-metal element. The first contact terminal is electrically connected to the metal-insulator-metal element. The second contact terminal is electrically connected to the metal-insulator-metal element.

In accordance with alternative embodiments of the present disclosure, a piezoelectric device including a substrate, a first electrode, a piezoelectric layer, a second electrode, a hydrogen blocking layer, a passivation layer, a first contact terminal and a second contact terminal is provided. The first electrode is disposed on the substrate. The piezoelectric layer is disposed on the first electrode. The second electrode is disposed on the piezoelectric layer. The hydrogen blocking layer is disposed on the second electrode and over the substrate. The passivation layer covers the hydrogen blocking layer, the second electrode, the piezoelectric layer and the first electrode. The first contact terminal is electrically connected to the first electrode. The second contact terminal is electrically connected to the second electrode.

In accordance with yet alternative embodiments of the present disclosure, a method of forming a piezoelectric device including at least the following steps is provided. A first conductive layer, a piezoelectric material layer and a second conductive layer are sequentially formed on a substrate. A first hydrogen blocking material layer is formed on the second conductive layer. The first hydrogen blocking material layer is patterned to form a first hydrogen blocking layer. A passivation layer is formed to cover the first hydrogen blocking layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A piezoelectric device, comprising:
   a substrate;
   a metal-insulator-metal element disposed on the substrate, wherein the metal-insulator-metal element comprises a bottom electrode, a top electrode and a piezoelectric layer between the top electrode and the bottom electrode;
   a hydrogen blocking layer covering the metal-insulator-metal element, wherein the hydrogen blocking layer includes a first hydrogen blocking layer, a second hydrogen blocking layer and a third hydrogen blocking layer sequentially stacked on the substrate, the first hydrogen blocking layer contacts a top surface of the top electrode, the second hydrogen blocking layer contacts a top surface of the piezoelectric layer and a sidewall of the top electrode, and the third hydrogen blocking layer contacts a top surface of the bottom electrode and a sidewall of the piezoelectric layer;
   a passivation layer covering the hydrogen blocking layer and the metal-insulator-metal element;
   a first contact terminal electrically connected to the metal-insulator-metal element; and
   a second contact terminal electrically connected to the metal-insulator-metal element.

2. The piezoelectric device of claim 1, wherein a material of the piezoelectric layer comprises lead zirconate titanate.

3. The piezoelectric device of claim 1, wherein the second hydrogen blocking layer contacts a sidewall of the first hydrogen blocking layer.

4. The piezoelectric device of claim 1, wherein in a top view, a span of the bottom electrode is greater than a span of the piezoelectric layer, and a span of the piezoelectric layer is greater than a span of the top electrode.

5. The piezoelectric device of claim 1, wherein a material of the hydrogen blocking layer comprises $Al_2O_3$, $TiO_2$, $Fe_2O_3$, $ZrO_2$, $ZnO$, $CuO$ or $Ta_2O_5$.

6. A piezoelectric device, comprising:
   a substrate;
   a bottom electrode disposed on the substrate;
   a piezoelectric layer disposed on the bottom electrode and exposing a portion of a top surface of the bottom electrode;
   a top electrode disposed on the piezoelectric layer and exposing a portion of a top surface of the piezoelectric layer;
   a hydrogen blocking layer disposed on the top electrode and over the substrate, wherein the hydrogen blocking layer comprises a first hydrogen blocking layer, a second hydrogen blocking layer and a third hydrogen blocking layer, the second hydrogen blocking layer is between the first hydrogen blocking layer and the third hydrogen blocking layer, a sidewall of the first hydrogen blocking layer is aligned with a sidewall of the top electrode, a sidewall of the second hydrogen blocking layer is aligned with a sidewall of the piezoelectric layer, and a sidewall of the third hydrogen blocking layer is aligned with a sidewall of the bottom electrode;
   a passivation layer covering the hydrogen blocking layer, the top electrode, the piezoelectric layer and the bottom electrode;
   a first contact terminal contacting the bottom electrode; and
   a second contact terminal contacting the top electrode.

7. The piezoelectric device of claim 6, wherein the first hydrogen blocking layer is disposed right above the top electrode and physically contacts the top electrode at a top surface of the top electrode.

8. The piezoelectric device of claim 7, the sidewalls of the top electrode, the piezoelectric layer and the bottom electrode are tilted sidewalls.

9. The piezoelectric device of claim 7, wherein the sidewalls of the top electrode, the piezoelectric layer and the bottom electrode are vertically aligned.

10. The piezoelectric device of claim 6, wherein in a top view, shapes of the top electrode, the piezoelectric layer and the bottom electrode are arranged as concentric circles.

11. The piezoelectric device of claim 6, wherein materials of the first hydrogen blocking layer, the second hydrogen blocking layer and the third hydrogen blocking layer are the same.

12. The piezoelectric device of claim 6, wherein in a cross-section, the bottom electrode, the piezoelectric layer and the top electrode constitute a staircase shaped stacked-structure.

13. The piezoelectric device of claim 6, wherein the passivation layer and the hydrogen blocking layer have a first contact hole and a second contact hole, the first contact terminal is electrically connected to the bottom electrode through the first contact hole, and the second contact terminal is electrically connected to the top electrode through the second contact hole.

14. The piezoelectric device of claim 6, wherein a material of the hydrogen blocking layer comprises $Al_2O_3$, $TiO_2$, $Fe_2O_3$, $ZrO_2$, ZnO, CuO or $Ta_2O_5$.

15. The piezoelectric device of claim 6, wherein at least one of the first hydrogen blocking material layer, the second hydrogen blocking material layer and the third hydrogen blocking material layer has a thickness that is greater than 200 Å.

16. A method of forming a piezoelectric device, comprising:
sequentially forming a first conductive layer, a piezoelectric material layer and a second conductive layer on a substrate;
forming a first hydrogen blocking material layer on the second conductive layer;
removing portions of the first hydrogen blocking material layer and the second conductive layer in a first patterning process to form a first hydrogen blocking layer and a top electrode;
forming a second hydrogen blocking material layer on the first hydrogen blocking layer;
removing portions of the second hydrogen blocking material layer and the piezoelectric material layer in a second patterning process to form a second hydrogen blocking layer and a piezoelectric layer;
forming a third hydrogen blocking material layer on the piezoelectric layer and on the second hydrogen blocking layer; and
removing portions of the third hydrogen blocking material layer and the first conductive layer in a third patterning process to form a third hydrogen blocking layer and a bottom electrode.

17. The method of claim 16, wherein:
the first hydrogen blocking layer contacts a top surface of the top electrode, the second hydrogen blocking layer covers the first hydrogen blocking layer and contacts a top surface of the piezoelectric layer, and the third hydrogen blocking layer covers the second hydrogen blocking layer and contacts a top surface of the bottom electrode.

18. The method of claim 16, wherein the piezoelectric material layer is formed by PVD or a sol-gel process.

19. The method of claim 16, wherein at least one of the first hydrogen blocking material layer, the second hydrogen blocking material layer and the third hydrogen blocking material layer is formed by atomic layer deposition (ALD) or physical vapor deposition (PVD).

20. The method of claim 16, wherein at least one of removing the portions of the first hydrogen blocking material layer and the second conductive layer, removing the portions of the second hydrogen blocking material layer and the piezoelectric material layer, and removing the portions of the third hydrogen blocking material layer and the first conductive layer includes using an ion-beam etching step.

* * * * *